United States Patent
Sheu

(10) Patent No.: US 6,593,597 B2
(45) Date of Patent: Jul. 15, 2003

(54) GROUP III-V ELEMENT-BASED LED HAVING ESD PROTECTION CAPACITY

(75) Inventor: Jinn-Kong Sheu, Jiang-Jiun Shiang (TW)

(73) Assignee: South Epitaxy Corporation, Tainan (TW)

(*) Notice: Subject to any disclaimer, the term of this patent is extended or adjusted under 35 U.S.C. 154(b) by 0 days.

(21) Appl. No.: 10/091,941

(22) Filed: Mar. 5, 2002

(65) Prior Publication Data

US 2002/0179914 A1 Dec. 5, 2002

(30) Foreign Application Priority Data

Jun. 5, 2001 (TW) .................................. 90113545 A

(51) Int. Cl.$^7$ .................... H01L 29/201; H01L 29/20
(52) U.S. Cl. ............................ 257/94; 257/96
(58) Field of Search .................... 257/86, 94, 96, 257/449

(56) References Cited

U.S. PATENT DOCUMENTS 5,657,056 A * 8/1997 Izumi et al. .................. 345/205
6,285,696 B1 * 9/2001 Bour et al. ..................... 372/45
6,514,782 B1 * 2/2003 Wierer et al. .................. 438/22
2002/0074553 A1 * 6/2002 Starikov et al. ............... 257/77

* cited by examiner

Primary Examiner—Allan R. Wilson
(74) Attorney, Agent, or Firm—J. C. Patents

(57) ABSTRACT

A group III–V element-based flip-chip assembled light-emitting diode structure with electrostatic protection capacity. A first conductive buffer layer and a second conductive buffer layer are formed over a transparent substrate. An active layer structure, a contact layer, an electrode is formed over the first conductive buffer layer. The active layer structure, the contact layer and the electrode together form a light-emitting diode structure. A metallic electrode is formed over the second conductive buffer layer to form a Schottky diode. Alternatively, a doped region is formed within the second conductive buffer layer to form a homojunction diode structure. The anode and cathode of the diode above the second conductive buffer layer are electrically connected to the cathode and anode of the light-emitting diode, respectively.

12 Claims, 6 Drawing Sheets

GROUP III-V ELEMENT-BASED LED HAVING ESD PROTECTION CAPACITY

CROSS-REFERENCE TO RELATED APPLICATION

This application claims the priority benefit of Taiwan application serial no. 90113545, filed Jun. 5, 2001.

BACKGROUND OF THE INVENTION

1. Field of Invention

The present invention relates to a light-emitting diode (LED). More particularly, the present invention relates to a group III–V element-based light-emitting diode with electrostatic discharge (ESD) protection capacity.

2. Description of Related Art

In recent years, group III–V nitride-based semiconductor materials have been used to produce light in the blue and ultraviolet range as well as high-temperature electronic devices. The material is quite versatile in the opto-electronic field. In particular, the group III–V group nitride-based semiconductor materials such as GaN, GaAlN, InGaN are suitable for fabricating light-emitting diodes. FIG. 1 is a schematic cross-sectional view of a conventional light-emitting diode constructed using group III–V nitride semiconductor material.

As shown in FIG. 1, the light-emitting diode is formed over a transparent substrate such as an aluminum oxide ($Al_2O_3$) layer. A nucleation layer 12 and an n-type conductive buffer layer 14 are sequentially formed over the substrate 10. The n-type buffer layer 14, for example, can be an n-doped gallium nitride (GaN) that facilitates subsequent crystal growth. A light-emitting active layer 18 is formed above the buffer layer 14. In general, a confinement layer or cladding layer 16 and 20 are formed, one above the active layer 18 and one below the active layer 18. The upper and the lower confinement layers (16 and 20) are doped using dopants of opposite polarity. In FIG. 1, the lower confinement layer 16 is an n-doped aluminum-gallium-nitride (AlGaN) layer while the upper confinement layer 20 is a p-doped aluminum-gallium-nitride (AlGaN) layer. A contact layer 22 is also formed over the upper confinement layer 20. The contact layer 22 can be a p-type gallium nitride (GaN) layer, for example. An electrode 24 serving as an anode of a diode is formed over the contact layer 22. In addition, another electrode 26 that serves as a cathode of the diode is formed over the buffer layer 14 in a region isolated from the lower confinement layer 16, the active layer 18 and the upper confinement layer 20.

FIG. 2A is a schematic circuit diagram showing a silicon-based shunt diode connected in parallel with a light-emitting diode (LED) to protect the LED against damages due electrostatic discharge. To prevent any damages to the light-emitting diode 30 due to electrostatic discharge (ESD) during operation, a silicon diode 40 is connected in parallel with the LED 30. Since the silicon diode 40 operates in the breakdown region, the diode 40 is always in a conductive state. If a normal forward bias voltage is applied to the two terminals V+ and V– of the LED 30, carrier passing through the p-n junction of the LED 30 produces a forward current that generates light. When an abnormal reversed voltage appears or there is an electrostatic discharge, excess voltage is discharged through the diode 40 operating in the breakdown mode. Since the discharge path goes through the second diode 40 instead of going through the LED 30, the LED 30 will not be damaged due to the presence of an abnormal voltage or electromagnetic discharge, which would causes the unrecoverable damage.

FIG. 2B is a schematic cross-sectional view of the LED in FIG. 2A with a silicon diode. According to the conventional method, the LED system is implemented using a flip-chip structure. As shown in FIG. 2B, the light emitting diode 30 includes a transparent substrate 32, an n-doped gallium nitride (GaN) layer 34, a p-doped gallium nitride (GaN) layer 36 and a pair of electrodes 38a and 38b. The diode 40 includes an n-doped silicon layer 42, a p-doped silicon layer 44 and a pair of metallic layers 46a and 46b. Areas 50a and 50b contain solder material. Through the solder material, the p-doped silicon layer 44 is electrically coupled to the n-doped gallium nitride layer 34 and the n-doped silicon layer 42 is electrically coupled to the p-doped gallium nitride layer 36. Thus, the structural layout shown in FIG. 2B produces the equivalent circuit shown in FIG. 2A.

A forward bias voltage is applied to the V+ terminal and the V– terminal in a normal operation. Hence, current flows from the p-doped gallium nitride layer 36 to the n-doped gallium nitride layer 34 so that generated light passes through the transparent substrate 32. When an abnormal reversed voltage appears or there is an electrostatic discharge, discharge current will pass from the n-doped silicon layer 42 to the p-doped silicon layer 44 without going through the main body of the light-emitting diode 30.

Although the aforementioned system is capable of minimizing damages to the light-emitting diode that result from an electrostatic discharge, the structure is difficult to manufacture. As shown in FIG. 2B, the light-emitting diode 30 section of the structure has to flip over the silicon diode. Not only is the structure difficult to fabricate, but mass production is also costly. Moreover, any deviation from alignment during package may result in a lower light-emitting power or device failure.

SUMMARY OF THE INVENTION

Accordingly, one object of the present invention is to provide a group III–V element-based light-emitting diode structure having electrostatic discharge protection capacity. The structure includes a reverse bias operating diode formed on the same side of a transparent substrate as the light-emitting diode so that manufacturing is simplified.

A second object of the present invention is to provide a group III–V element-based light emitting diode having a flip-chip structure and electrostatic discharge protection capacity. The structure incorporates a Schottky diode or a shunt diode so that electrostatic discharge protection capacity is enhanced.

A third object of the present invention is to provide a group III–V element-based light emitting diode having a flip-chip structure and electrostatic discharge protection capacity. The structure not only reduces processing steps, but also increases light-emitting power of the light-emitting diode.

To achieve these and other advantages and in accordance with the purpose of the invention, as embodied and broadly described herein, the invention provides a group III–V element-based light emitting diode having electrostatic discharge protection capacity. The structure includes a transparent substrate, a nucleation layer, a conductive buffer layer, a first confinement layer, an active layer, a second confinement layer, a contact layer, a first electrode, a second electrode, a third electrode and a fourth electrode. The nucleation layer is formed over the transparent substrate. The nucleation layer is a composite layer that includes a first nucleation layer and a second nucleation layer. The first nucleation layer and the second nucleation layer are isolated from each other. Similarly, the conductive buffer layer is a composite layer that includes a first conductive buffer layer and a second conductive buffer layer. The first conductive buffer layer and the second conductive buffer layer are formed over the first nucleation layer and the second nucleation layer, respectively. The first confinement layer, the active layer, the second confinement layer and the contact layer are formed over the first conductive buffer layer.

The first confinement layer is above the first conductive buffer layer and both layers are doped identically. The active layer is above the first confinement layer. The active layer is a semiconductor material layer containing doped group III–V nitride-based materials. The second confinement layer is above the active layer. The second confinement layer contains dopants that are different from the dopants in the first confinement layer. The contact layer is above the second confinement layer. The contact layer contains dopants identical to the dopants in the second confinement layer.

The first electrode serving as an anode of the light-emitting diode is above the contact layer. The second electrode serving as a cathodeof the light-emitting diode and the first conductive buffer layer are in contact but they are isolated from the first confinement layer, the second confinement layer, the active layer, the contact layer and the transparent substrate. The third electrode is above the second conductive buffer layer. The third electrode and the second conductive buffer layer together form a Schottky contact. Furthermore, the third electrode couples electrically with the second electrode. The fourth electrode is above the second conductive buffer layer but is isolated from the third electrode. The fourth electrode couples electrically with the first electrode.

This invention also provides a group III–V element-based light emitting diode having electrostatic discharge protection capacity. The structure includes a transparent substrate, a nucleation layer, a conductive buffer layer, a doped region, a first confinement layer, an active layer, a second confinement layer, a contact layer, a first electrode, a second electrode, a third electrode and a fourth electrode. The nucleation layer is formed over the transparent substrate. The nucleation layer is a composite layer that includes a first nucleation layer and a second nucleation layer. The first nucleation layer and the second nucleation layer are isolated from each other. Similarly, the conductive buffer layer is a composite layer that includes a first conductive buffer layer and a second conductive buffer layer. The first conductive buffer layer and the second conductive buffer layer are formed over the first nucleation layer and the second nucleation layer, respectively. The first confinement layer, the active layer, the second confinement layer and the contact layer are formed over the first conductive buffer layer. The doped region is inside the second conductive buffer layer interfacing with the surface of neighboring second conductive buffer layer to form a p-n junction diode.

The first confinement layer is above the first conductive buffer layer and both layers are doped identically. The active layer is above the first confinement layer. The active layer is a semiconductor material layer containing doped group III–V nitride-based materials. The second confinement layer is above the active layer. The second confinement layer contains dopants that are different from the dopants in the first confinement layer. The contact layer is above the second confinement layer. The contact layer contains dopants identical to the dopants in the second confinement layer.

The first electrode serving as an anode of the light-emitting diode is above the contact layer. The second electrode serving as a cathode of the light-emitting diode and the first conductive buffer layer are in contact but they are isolated from the first confinement layer, the second confinement layer, the active layer, the contact layer and the transparent substrate. The third electrode is above the doped region inside the second conductive buffer layer. The third electrode and the second conductive buffer layer together form a p-n junction diode. Furthermore, the third electrode couples electrically with the second electrode. The fourth electrode is above the second conductive buffer layer but is isolated from the third electrode. The fourth electrode also couples electrically with the first electrode.

The present invention also provides a group III–V element-based light emitting diode having a flip-chip structure and electrostatic discharge protection capacity. The aforementioned two group III–V element-based light emitting diode structures are interlocked together using a flip-chip process on an insulating substrate. The first electrode and the fourth electrode are connected to a first metallic film through a solder material so that the first electrode and the fourth electrode are electrically coupled. The first electrode and the fourth electrode couples with the insulating substrate via the first metallic film. Similarly, the third electrode and the second electrode are connected to a second metallic film through a solder material so that the second electrode and the third electrode are electrically coupled. The second electrode and the third electrode couples with the insulating substrate via the second metallic film. The first and the second metallic film can be the copper film on a printed circuit board. With the light-emitting diode overhanging the insulating substrate, light produced by the light-emitting diode is able to shine through the transparent substrate. Hence, light-emitting power is increased while damages due to electrostatic discharge are reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
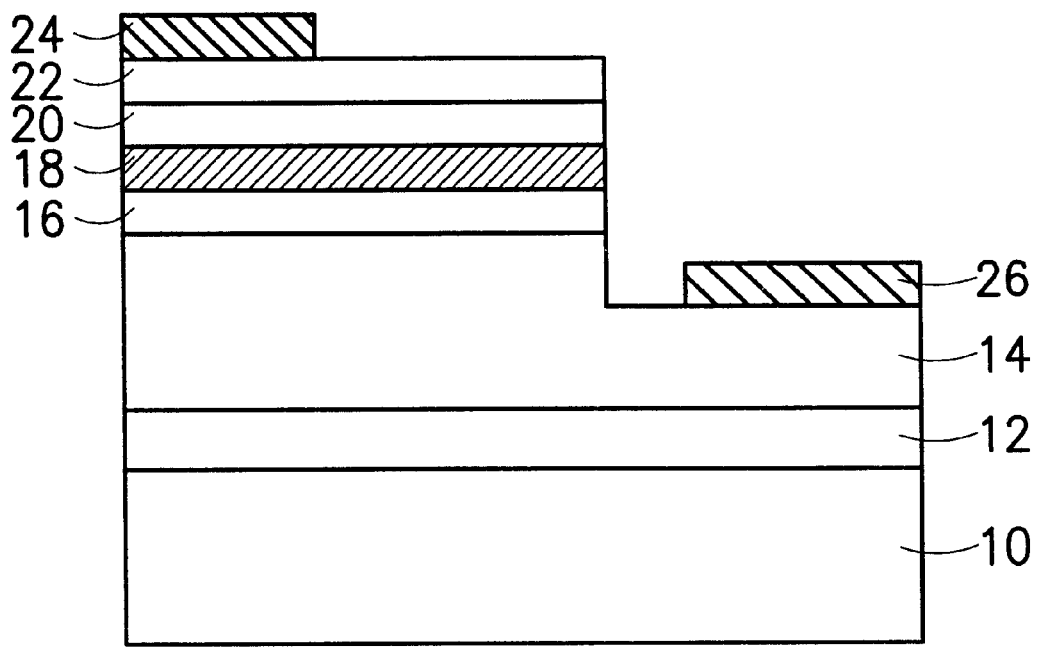
FIG. 1 is a schematic cross-sectional view of a conventional light-emitting diode constructed using group III–V nitride semiconductor material.
Figure 2A:
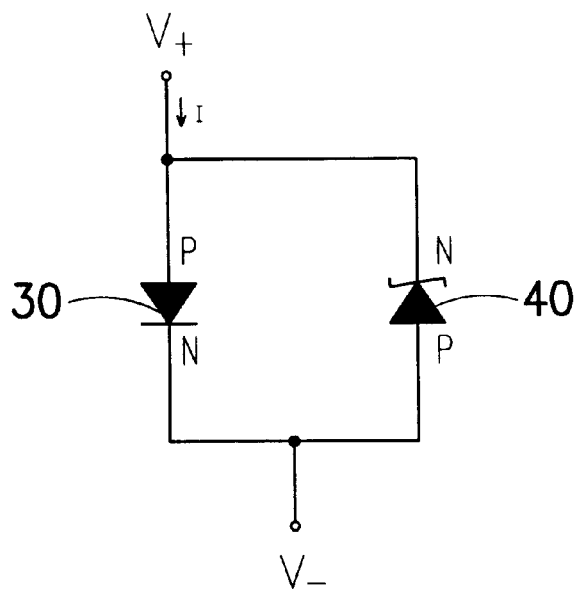
FIG. 2A is a schematic circuit diagram showing a silicon-doped shunt diode connected in parallel with a light-emitting diode (LED) to protect the LED against damages due to electrostatic discharge.
Figure 2B:
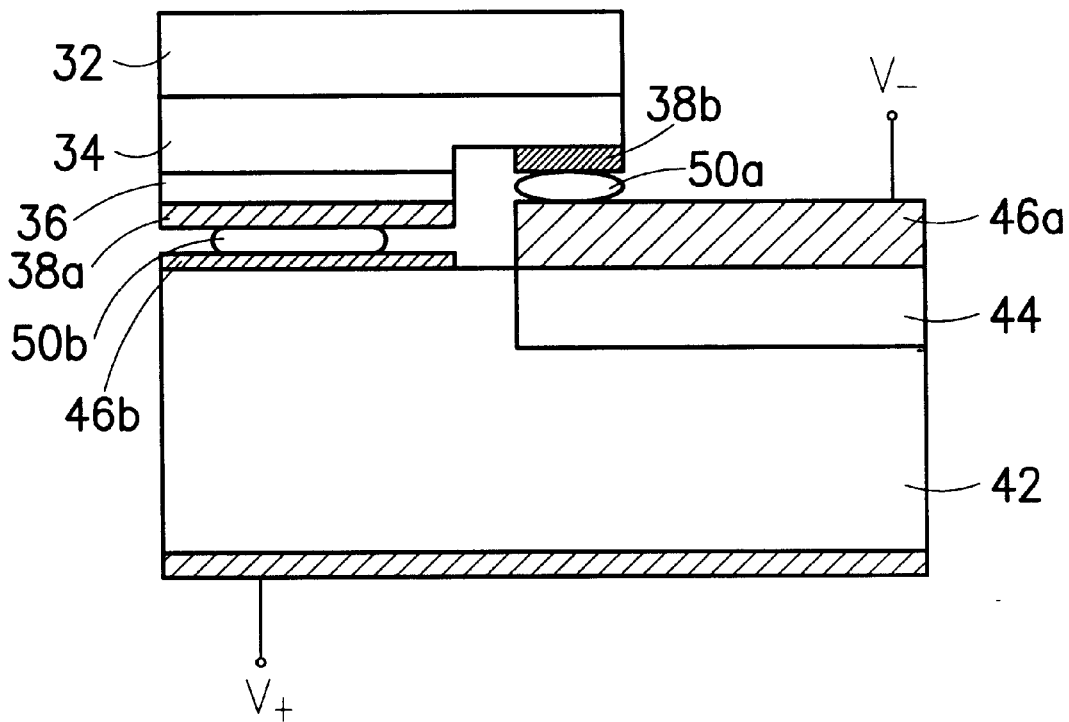
FIG. 2B is a schematic cross-sectional view of the LED in FIG. 2A with a silicon diode.

Reference will now be made in detail to the present preferred embodiments of the invention, examples of which are illustrated in the accompanying drawings. Wherever possible, the same reference numbers are used in the drawings and the description to refer to the same or like parts.

In this invention, the diode for protecting the light-emitting diode (LED) against accidental electrostatic discharge is formed on the same side of a substrate as the LED. With this structural arrangement, conventional manufacturing steps can be used to limit production cost. In the meantime, a Schottky diode, shunt diode or similar type of diodes capable of operating the breakdown region is employed as an LED protector. The following are description of LED structure having either a Schottky or a shunt diode therein.

Figure 3A:
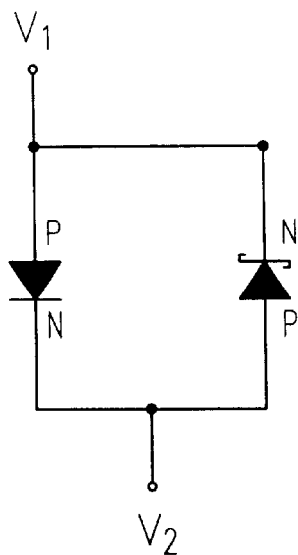
FIG. 3A is a schematic circuit diagram showing a LED having a parallel-connected Schottky diode to protect the LED against damages due to electrostatic discharge according to a first preferred embodiment of this invention.
Figure 3B:
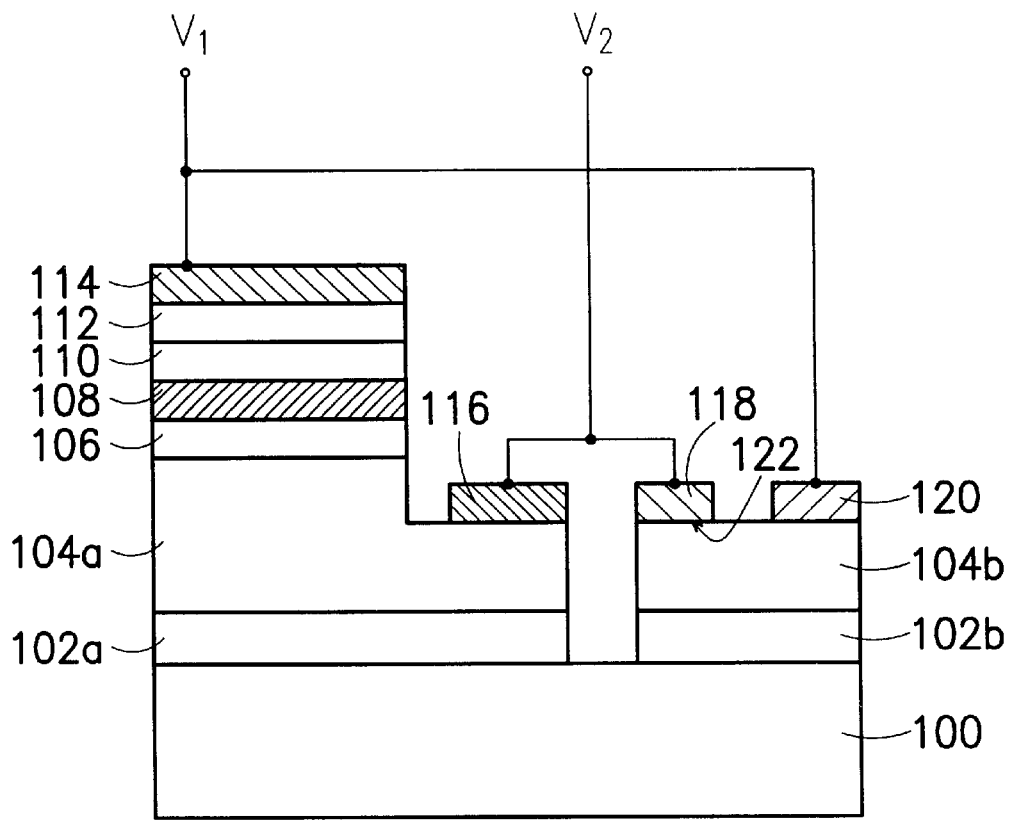
FIG. 3B is a schematic cross-sectional view of the LED and accompanied Schottky diode shown in FIG. 3A.

FIG. 3A is a schematic circuit diagram showing a LED having a parallel-connected Schottky barrier diode (SBD) to protect the LED against damages due to electrostatic discharge according to a first preferred embodiment of this invention. FIG. 3B is a schematic cross-sectional view of the LED and accompanied Schottky barrier diode shown in FIG. 3A.

As shown in FIG. 3A, to prevent accidental damage to a gallium nitride structure inside the LED 30 due to electrostatic discharge during operation, a Schottky barrier diode (SBD) 40 is connected in parallel to the LED 30 but with biasing polarity connected in reverse with respect to the LED 30. The Schottky barrier diode can be, for example, an n-doped gallium nitride (GaN) semiconductor layer in contact with a metallic layer. In general, the main ingredients constituting the Schottky diode 40 are identical to that of the LED 30. In the presence of the interconnected Schottky diode 40 and gallium nitride LED, any abnormal reverse voltage applied to the LED system turns on the Schottky barrier diode 40 and diverts a large portion of any abnormal reverse current away via the Schottky barrier diode 40.

When a normal forward bias voltage is applied to the two terminals V1 and V2 of the LED 30, most of the carrier inside the LED 30 is able to penetrate through the p-n junction to form a forward current for producing light. However, if a reverse voltage is applied to the LED 30 or an electrostatic discharge occur across the LED 30, the resulting high voltage can be discharged through the Schottky barrier diode 40. Since most electric charges pass through the Schottky barrier diode 40 instead of the LED 30, any damaging effects on the LED 30 are minimized.

As shown in FIG. 3B, the LED structure includes a transparent substrate 100, a first nucleation layer 102a, a second nucleation layer 102b, a first conductive buffer layer 104a, a second conductive buffer layer 104b, a lower confinement layer 106, an active layer 108, an upper confinement layer 110, a contact layer 112, a transparent electrode 114, an electrode 116, a Schottky contact electrode 118 and an ohmic contact electrode 120.

The transparent substrate 100 can be made from, for example, sapphire, silicon carbide (SiC), zinc oxide (ZnO), gallium nitride (GaN), aluminum nitride (AlN), glass or silicon, gallium phosphorus (GaP), gallium arsenic (GaAs), aluminum oxide ($Al_2O_3$) or other suitable substrate materials. The first nucleation layer 102a and the second nucleation layer 102b are formed over the transparent substrate 100. The first and the second nucleation layer 102a, 102b can be made from a material such as $Al_uIn_vGa_{l-u-v}N$ ($u,v \geq 0; 0 \leq u+v \leq 1$). The first nucleation layer 102a and the second nucleation layer 102b are isolated from each other. A subsequently formed light-emitting diode is above the first nucleation layer 102a and the subsequently formed Schottky diode is above the second nucleation layer 102b.

The first conductive buffer layer 104a is formed over the first nucleation layer 102a and the second conductive buffer layer 104b is formed over the second nucleation layer 102b. The first and the second conductive buffer layer 104a, 104b are electrically isolated from each other. The first and the second conductive buffer layer 104a, 104b can be made from a material such as $Al_cIn_dGa_{1-c-d}N$ ($c,d \geq 0; 0 \leq c+d \leq 1$). In general, growing a high-quality p-type or n-type semiconductor crystal layer over the substrate is difficult. This is because lattice matching between p or n-type gallium nitride-based semiconductor and the aforementioned substrate crystal lattice is usually poor. Therefore, forming a conductive buffer layer 104a using a gallium nitride-based compound is necessary. In this embodiment, an n-type $Al_cIn_dGa_{1-c-d}N$ layer is formed to serve as a buffer layer so that growth rate of subsequent grown gallium nitride crystal layer is increased and quality of the layer is improved.

The electrode 116 is formed over the first conductive buffer layer 104a isolated from the lower confinement layer 106, the active layer 108 and the upper confinement layer 110. The electrode 116 serves as a cathode of the light-emitting diode. Material constituting the electrode 116 includes, for example, Ti/Al. The electrode 116 must have good ohmic contact with the conductive buffer layer 104a.

The lower confinement layer 106 is formed over the first conductive buffer layer 104a. The lower confinement layer can be made from a gallium-nitride based group III–V compound, for example, a group IV or VI group element doped n-type compound $Al_xIn_yGa_{l-x-y}N$ ($x,y \geq 0; 0 \leq x+y \leq 1$). Since the process of selecting n-type dopants for doping is familiar to those knowledgeable in the semiconductor manufacturing, detailed description of the selection process is omitted. The active layer 108 or the so-called light-emitting layer is formed over the lower confinement layer 106. The active layer 108 can be made from a gallium-nitride-based group III–V compound. In this embodiment, the active layer 108 is a doped $Al_aIn_bGa_{1-a-b}N/Al_cIn_dGa_{1-c-d}N$ ($a,b \geq 0; 0 \leq a+b < 1; x > c > a$) in multiple quantum well. The dopants can be n-type dopants or p-type dopants. Since the selection of n-type of p-type dopants is familiar to those skilled in semiconductor production, description of the selection process is omitted here.

The upper confinement layer 110 is formed over the active layer 108. The upper confinement layer 110 can be made from a gallium-nitride based group III–V compound, for example, group II element doped p-type $Al_xIn_yGa_{l-x-y}N$ ($x,y \geq 0; 0 \leq x+y \leq 1; x > c$). Here, since the selection of p-type dopants is familiar to those skilled in semiconductor production, description of the selection process is omitted.

The n-type or p-type active layer 108 is clamped via the lower confinement layer 106 and the upper confinement layer 110. Material selection, compositional ratio, dopant selection and so on of the various gallium-nitride based group III–V compound all depend on actual design requirement. The aforementioned example states only a particular case.

The contact layer 112 is formed over the upper confinement layer 110. The contact layer 112 is made from a gallium-nitride-based group III–V compound, for example, $Al_uIn_vGa_{1-u-v}N$ ($u,v \geq 0; 0 \leq u+v \leq 1$). The transparent electrode 114 is formed over the contact layer 112. The transparent electrode 114 is made from a malleable metal such as Ni/Au, TiN, Pd/Au/Pt/Au, or an n-type transparent conductive oxide (TCO) such as ITO, CTO, $Zn_2SnO_4$, $ZnSnO_3$, $MgIn_2O_4$, $GaInO_3$, $(Ga,In)_2O_3$, $Zn_2In_2O_5$, $In_4Sn_3O_{12}$, $AgInO_2$:Sn or $In_2O_3$:Zn, or a p-type TCO such as $CuAlO_2$, LaCuOS, $CuGaO_2$ or $SrCu_2O_2$ and so on. Ultimately, a complete light-emitting diode structure is formed above the first nucleation layer 102a and the first conductive buffer layer 104a.

The Schottky contact electrode 118 is formed over the second conductive buffer layer 104b. The Schottky contact electrode 118 can be a metallic or metallic alloy layer such as Ni/Au, or a transparent conductive layer such as n-type transparent conductive oxide (TCO) including ITO, CTO, $AgInO_2$:Sn or $In_2O_3$:Zn or p-type transparent conductive oxide including $CuAlO_2$, LaCuOS, $CuGaO_2$ or $SrCu_2O_2$ and so on. The Schottky contact electrode 118 and the n-doped second conductive buffer layer 104b together constitute a so-called gallium-nitride based Schottky barrier diode (GaN SBD). The ohmic electrode 120 is formed in a region above the second conductive buffer layer 104b but away from the Schottky contact electrode 118. The ohmic electrode 120 can be made from, for example, Ti/Al or a material having similar type of properties.

The ohmic contact electrode 120 and the transparent electrode 114 are electrically connected together. Similarly, the Schottky contact electrode 118 and the electrode 116 are electrically connected together. Finally, a structure equivalent to the circuit shown in FIG. 3A is formed.

In a normal operation, a forward bias voltage is applied to the V+ terminal and the V− terminal of the light-emitting diode so that a current flows from the p-doped layer to the n-doped layer. Light generated inside the light-emitting layer 108 passes out via the transparent electrode 114 or the transparent substrate 100. When an abnormal reverse-biasd voltage appears or there is an electrostatic discharge, discharge current will pass through the electrode 118, the n-doped layer 104b and the electrode 120 instead of going through the main body of the light-emitting diode.

As shown in FIG. 3B, the reverse-operating diode is formed on the same side of the transparent substrate as the light-emitting diode. Hence, manufacturing is very much simplified. In addition, connecting the light-emitting diode and the Schottky diode in parallel increases electrostatic discharge protection capacity and improves light-emitting power of the LED.

Figure 4A:
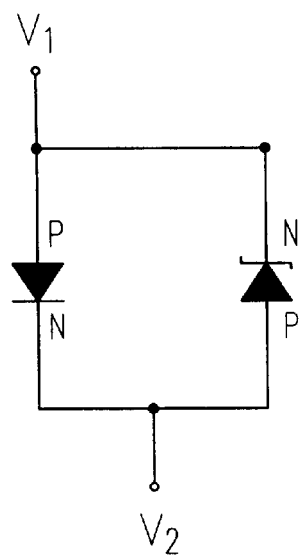
FIG. 4A is a schematic circuit diagram showing a LED having a parallel-connected gallium nitride (GaN) shunt diode to protect the LED against damages due to electrostatic discharge according to a second preferred embodiment of this invention.
Figure 4B:
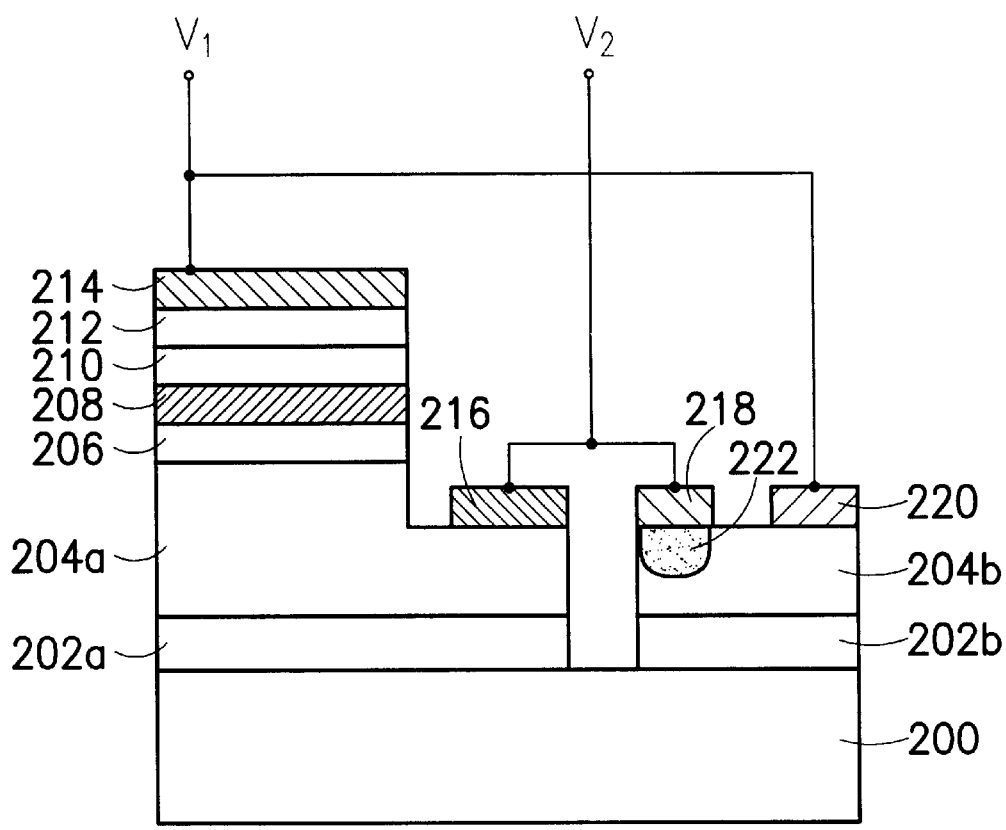
FIG. 4B is a schematic cross-sectional view of the LED and accompanied gallium nitride shunt diode shown in FIG. 4A.

FIG. 4A is a schematic circuit diagram showing a LED having a parallel-connected gallium nitride (GaN) shunt diode to protect the LED against damages due to electrostatic discharge according to a second preferred embodiment of this invention. FIG. 4B is a schematic cross-sectional view of the LED and accompanied gallium nitride shunt diode shown in FIG. 4A.

As shown in FIG. 4A, the parallel-connected shunt diode is in a conductive state when an abnormal reverse-biased voltage is applied or there is an electrostatic discharge. Excess voltage dissipates by discharging through the shunt diode. Since a large portion of current passes through the shunt diode instead of the light-emitting diode (LED), the LED is protected against damages due to an excessive current. On the other hand, when a normal forward bias voltage is applied to the two terminals V1 and V2 of the LED, most carriers inside the LED are able to penetrate the p-n junction to produce a forward current so that light is emitted.

As shown in FIG. 4B, the LED structure includes a transparent substrate 200, a first nucleation layer 202a, a second nucleation layer 202b, a first conductive buffer layer 204a, a second conductive buffer layer 204b, a lower confinement layer 206, an active layer 208, an upper confinement layer 210, a contact layer 212, a transparent electrode 214, an electrode 216, a electrode 218, an electrode 220 and a p-doped region 222.

The transparent substrate 200 can be made from, for example, sapphire, silicon carbide (SiC), zinc oxide (ZnO), gallium nitride (GaN), aluminum nitride (AlN), glass or silicon, gallium phosphorus (GaP), gallium arsenic (GaAs), aluminum oxide ($Al_2O_3$) or other suitable substrate materials. The first nucleation layer 202a and the second nucleation layer 202b are formed over the transparent substrate 200. The first and the second nucleation layer 202a, 202b can be made from a material such as $Al_uIn_vGa_{1-u-v}N$ ($u,v \geq 0; 0 \leq u+v \leq 1$). The first nucleation layer 202a and the second nucleation layer 202b are isolated from each other. A subsequently formed light-emitting diode is above the first nucleation layer 202a and the subsequently formed shunt diode is above the second nucleation layer 202b.

The first conductive buffer layer 204a is formed over the first nucleation layer 202a and the second conductive buffer layer 204b is formed over the second nucleation layer 202b. The first and the second conductive buffer layer 204a, 204b are electrically isolated from each other. The first and the second conductive buffer layer 204a, 204b can be made from a material such as $Al_cIn_dGa_{1-c-d}N$ ($c,d \geq 0; 0 \leq c+d \leq 1$). In general, growing a high-quality p-type or n-type semiconductor crystal layer over the substrate is difficult. This is because lattice matching between p or n-type gallium nitride-based semiconductor and the aforementioned substrate crystal lattice is usually poor. Therefore, forming a conductive buffer layer 204a using a gallium nitride-based compound is necessary. In this embodiment, an n-type $Al_cIn_dGa_{1-c-d}N$ layer is formed to serve as a buffer layer so that growth rate of subsequent grown gallium nitride crystal layer is increased and quality of the layer is improved.

The electrode 216 is formed over the first conductive buffer layer 204a isolated from the lower confinement layer 206, the active layer 208 and the upper confinement layer 210. The electrode 216 serves as a cathode of the light-emitting diode. Material constituting the electrode 216 includes, for example, Ti/Al. The electrode 216 must have good ohmic contact with the conductive buffer layer 204a. The p-doped region 222 is formed inside but close to the upper surface of the second conductive buffer layer 204b. The doped region 222 can be formed by diffusion or ion implantation techniques. Group II elements such as magnesium, beryllium, zinc, cadmium or calcium may be used. The second conductive buffer layer 204b and the p-doped region 222 together form a gallium-nitride p-n junction diode.

The lower confinement layer 206 is formed over the first conductive buffer layer 204a. The lower confinement layer can be made from a gallium-nitride based group III–V compound, for example, a group IV or VI group element doped n-type compound $Al_xIn_yGa_{1-x-y}N$ ($x,y \geq 0; 0 \leq x+y \leq 1$; x>c). Since the process of selecting n-type dopants for doping is familiar to those knowledgeable in the semiconductor manufacturing, detailed description of the selection process is omitted. The active layer 208 is formed over the lower confinement layer 206. The active layer 208 can be made from a gallium-nitride-based group III–V compound. In this embodiment, the active layer 208 is a doped $Al_aIn_bGa_{1-a-b}N/Al_cIn_dGa_{1-c-d}N$ ($a,b \geq 0; 0 \leq a+b \leq 1; x>c>a$) in multiple quantum well. The dopants can be n-type dopants or p-type dopants. Since the selection of n-type of p-type dopants is familiar to those skilled in semiconductor production, description of the selection process is omitted here.

The upper confinement layer 210 is formed over the active layer 208. The upper confinement layer 210 can be made from a gallium-nitride based group III–V compound, for example, group II element doped p-type $Al_xIn_yGa_{1-x-y}N$ ($x,y \geq 0; 0 \leq x+y \leq 1$; x>c). Material selection, compositional ratio, dopant selection and so on of the various gallium-nitride based group III–V compound all depend on actual design requirement. The aforementioned example states only a particular case.

The contact layer 212 is formed over the upper confinement layer 210. The contact layer 212 is made from a gallium-nitride-based group III–V compound, for example, $Al_uIn_vGa_{1-u-v}N$ ($u,v \geq 0; 0 \leq u+v \leq 1$). The transparent electrode 214 is formed over the contact layer 212. The transparent electrode 214 is made from a thin metal such as Ni/Au, TiN, Pd/Au/Pt/Au, or an n-type transparent conductive oxide (TCO) such as ITO, CTO, $Zn_2SnO_4$, $ZnSnO_3$, $MgIn_2O_4$, $GaInO_3$, $(Ga,In)_2O_3$, $Zn_2In_2O_5$, $In_4Sn_3O_{12}$, $AgInO_2$:Sn or $In_2O_3$:Zn, or a p-type TCO such as $CuAlO_2$, LaCuOS, $CuGaO_2$ or $SrCu_2O_2$ and so on. Ultimately, a complete light-emitting diode structure is formed above the first nucleation layer 202a and the first conductive buffer layer 204a.

The electrode 218 is formed over the doped region 222 inside the second conductive buffer layer 204b. The contact electrode 218 can be made from a material such as Ni/Au. The electrode 220 is formed over the second conductive buffer layer 204b. The electrode 220 can be made from, for example, Ti/Al or a material having similar type of properties.

The electrode 220 and the transparent electrode 214 are electrically connected together. Similarly, the electrode 218 and the electrode 216 are electrically connected together. Finally, a structure equivalent to the circuit shown in FIG. 4A is formed.

In a normal operation, a forward bias voltage is applied to the V+ terminal and the V− terminal of the light-emitting diode so that a current flows through the p-n junction. Light generated inside the light-emitting layer 208 passes out via the transparent electrode 214. When an abnormal reverse-biased voltage appears or there is an electrostatic discharge, discharge current will pass through the electrode 218, the p-doped region 222, the n-doped layer 204b and the electrode 220 instead of going through the main body of the light-emitting diode.

As shown in FIG. 4B, the shunt diode is formed on the same side of the transparent substrate as the light-emitting diode. Hence, manufacturing is very much simplified. In addition, connecting the light-emitting diode and the shunt diode in parallel increases electrostatic discharge protection capacity and improves light-emitting power of the LED.

Figure 5:
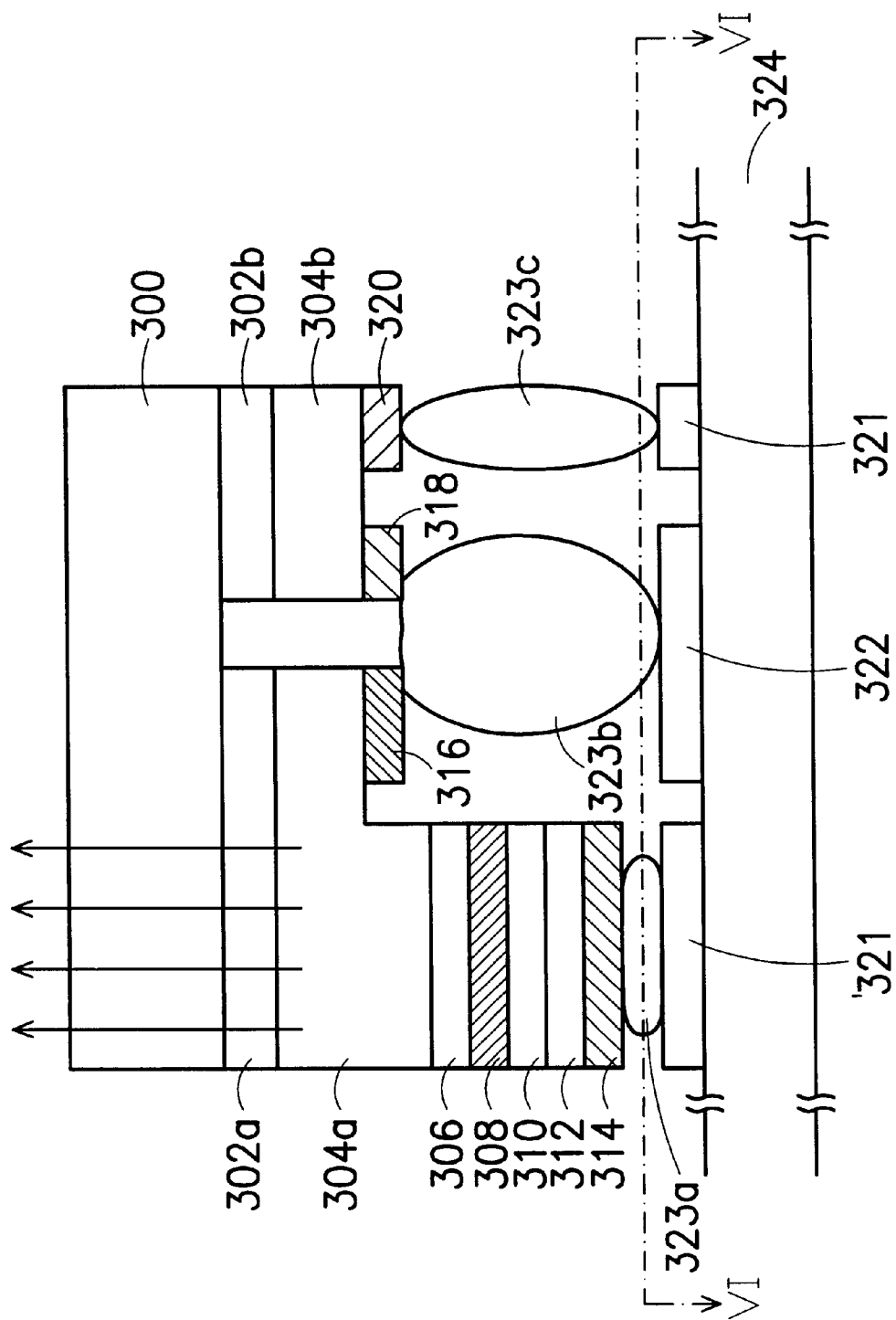
FIG. 5 is a schematic cross-sectional view of the LED structure shown in either FIG. 3B or FIG. 4B fabricated as a flip-chip over a substrate.

FIG. 5 is a schematic cross-sectional view of the LED structure shown in either FIG. 3B or FIG. 4B fabricated as a flip-chip over a substrate. As shown in FIG. 5, the group III–V light-emitting diode structure is formed over an insulating substrate 324. The insulating substrate 324 can be a ceramic plate, for example.

The light-emitting diode structure includes a transparent substrate 300, nucleation layers 302a/302b, conductive buffer layers 304a/304b, confinement layers 306/310, an active layer (light-emitting layer) 308, a contact layer 312, an LED anode electrode 314, an LED cathode electrode 316, a shunt diode anode electrode 318 and a shunt diode cathode electrode 320. Since the structure is identical to the one shown in FIG. 3B, description is not repeated here. However, the group III–V LED can also have a structure similar to the one shown in FIG. 4B.

The anode electrode 314 of LED and the cathode electrode 320 of shunt diode are connected to a metallic film 321 via solder balls 323a and 323c, respectively. Hence, the anode electrode 314 and the cathode electrode 320 of the shunt diode are electrically connected together. The metallic film 321 couples with the insulating substrate 324. Meanwhile, the shunt diode anode electrode 318 and the LED cathode electrode 316 are connected to a metallic film 322 via a solder ball 323b. The metallic film 322 couples with the insulating substrate 324. The metallic films 321 and 322 can be the copper films on a printed circuit board, for example.

As shown in FIG. 5, light emitted by the light-emitting diode emerges from the transparent substrate 300 of the flip-chip structure. Hence, light-emitting power of the LED is boosted.

Figure 6:
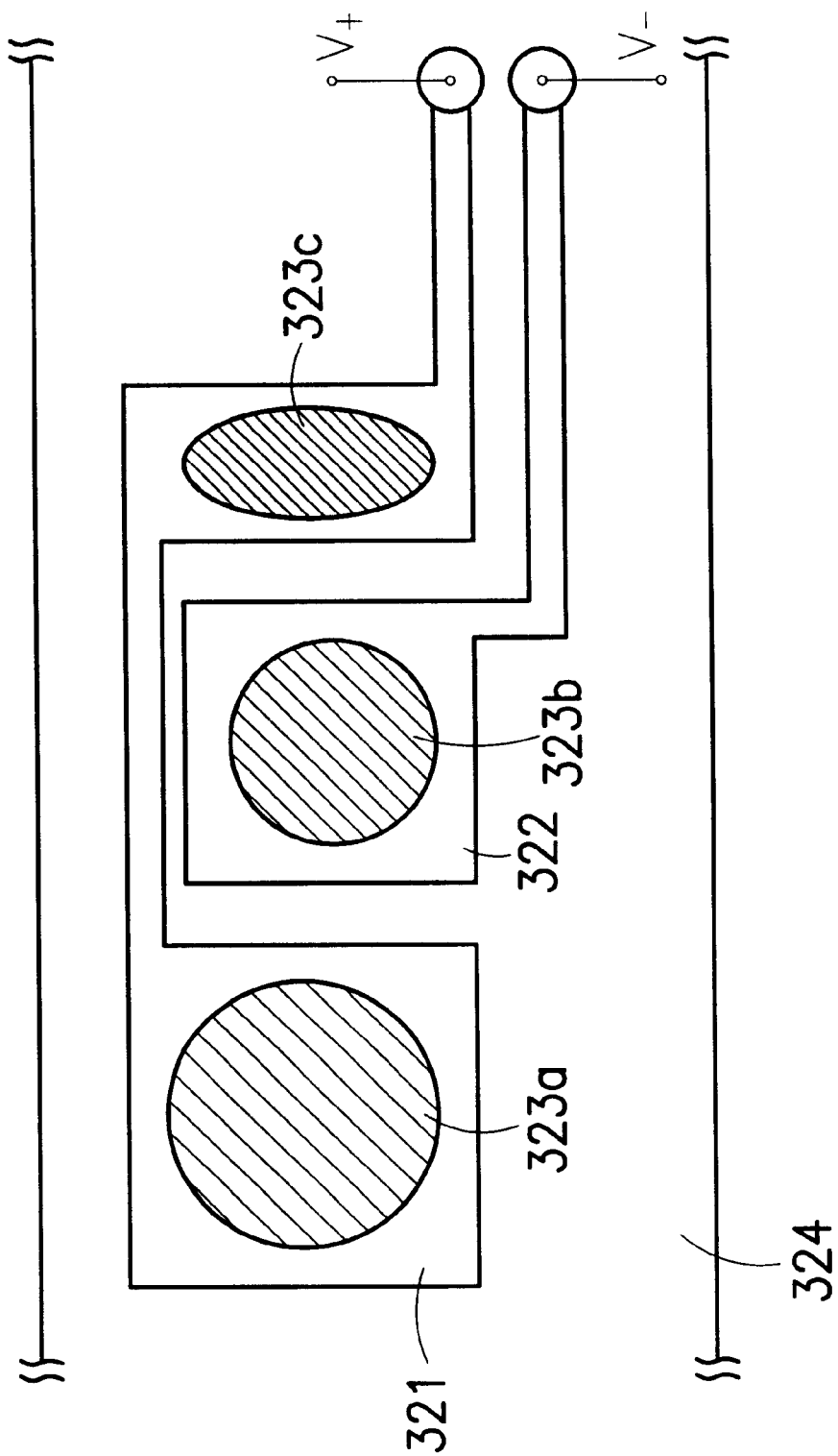
FIG. 6 is a cross-sectional view along line VI—VI of FIG. 5.

FIG. 6 is a cross-sectional view along line VI—VI of FIG. 5. The relationship between the metallic films 321/322, the solder balls 323a/323b/323c, the insulating substrate 324 and the terminals is shown.

In conclusion, unlike a conventional LED structure with the LED overhanging over a silicon diode, this invention permits the use of a patterned photomask to form the LED and the Schottky or shunt diode on the same substrate. According to the flip-chip design of this invention, the shunt diode or Schottky diode is formed on the same side of the transparent substrate as the light-emitting diode. Ultimately, manufacturing is simplified, production cost is reduced and light-emitting power is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A group III–V element-based light-emitting diode (LED) structure having electrostatic protection capacity, comprising:

a transparent substrate;

a nucleation area layer including a first nucleation layer and a second nucleation layer both formed over the transparent substrate, wherein the first and the second nucleation layer are isolated from each other;

a conductive buffer area layer including a first conductive buffer layer and a second conductive buffer layer formed over the first nucleation layer and the second nucleation layer, respectively;

a first confinement layer over the first conductive buffer layer, wherein the first confinement layer and the conductive buffer area layer contain identical dopants;

an active layer over the first confinement layer, wherein material forming the active layer includes doped group III–V element-based semiconductor material;

a second confinement layer over the active layer, wherein the second confinement layer and the first confinement layer contain different dopants;

a contact layer over the second confinement layer, wherein the contact layer and the second confinement layer contain identical dopants;

a first electrode over the contact layer;

a second electrode in contact with the first conductive buffer layer but isolated from the first confinement, layer, the active layer, the second confinement layer, the contact layer and the first electrode;

a third electrode over the second buffer conductive layer and the third electrode together with the second conductive buffer layer forming a Schottky barrier diode, wherein the third electrode connects electrically with the second electrode; and a fourth electrode over the second conductive buffer layer isolated from the third electrode region, wherein the fourth electrode connects electrically with the first electrode.

2. The LED structure of claim 1, wherein the doped active layer is a group III–V element-based semiconductor material including $Al_aIn_bGa_{1-a-b}N/Al_cIn_dGa_{1-c-d}N$ ($a,b \geqq 0; 0 \leqq a+b<1$; $x>c>a$) in multiple quantum well.

3. The LED structure of claim 1, wherein material constituting the transparent substrate includes sapphire, silicon carbide (SiC), zinc oxide (ZnO), gallium nitride (GaN), aluminum nitride (AlN), glass or silicon, gallium phosphorus (GaP), gallium arsenic (GaAs), aluminum oxide ($Al_2O_3$).

4. The LED structure of claim 1, wherein the first electrode includes a transparent electrode.

5. The LED structure of claim 4, wherein material constituting the transparent electrode includes metals and their composite assembly commonly used in semiconductor manufacturing including n-type transparent conductive oxide (TCO), ITO, CTO, $Zn_2SnO_4$, $ZnSnO_3$, $MgIn_2O_4$, $GaInO_3$, $(Ga,In)_2O_3$, $Zn_2In_2O_5$, $In_4Sn_3O_{12}$, $AgInO_2$:Sn or $In_2O_3$:Zn, or a p-type TCO such as $CuAlO_2$, LaCuOS, $CuGaO_2$ or $SrCu_2O_2$.

6. The LED structure of claim 1, wherein material constituting the second electrode includes Ti/Al.

7. The LED structure of claim 1, wherein material constituting the third electrode includes metals and a composite assembly thereof commonly used in semiconductor manufacturing.

8. The LED structure of claim 1, wherein material constituting the fourth electrode includes Ti/Al.

9. A group III–V element-based light-emitting diode (LED) structure having electrostatic protection capacity, comprising:

a transparent substrate;

a conductive buffer area layer including a first conductive buffer layer and a second conductive buffer layer formed over a first nucleation layer and a second nucleation layer, respectively;

an active layer structure over the first conductive buffer layer, wherein the active layer is formed using doped group III–V element-based semiconductor material;

a contact layer over the active layer structure, wherein the contact layer and the second confinement layer contain identical dopants;

a first electrode over the contact layer;

a second electrode in contact with the first conductive buffer layer but isolated from the active layer structure, the contact layer and the transparent electrode;

a third electrode over the second conductive buffer layer, wherein the third electrode and the second conductive buffer layer together form a Schottky diode, and the third electrode connects electrically with the second electrode; and a fourth electrode over the second conductive buffer layer isolated from the third electrode region, wherein the fourth electrode connects electrically with the first electrode.

10. The LED structure of claim 9, wherein the structure includes a nucleation area layer having a first nucleation layer and a second nucleation layer between the transparent substrate and the first and the second conductive buffer layer, respectively, and the first and the second nucleation layer are isolated from each other.

11. The LED structure of claim 9, wherein the active layer structure further includes:

a first confinement layer over the first conductive buffer layer, wherein the first confinement layer and the conductive buffer area layer contain identical dopants;

an active layer over the first confinement layer, wherein the active layer is formed using group III–V element-based semiconductor material; and a second confinement layer over the active layer, wherein the second confinement layer and the first confinement layer contain different dopants.

12. The LED structure of claim 9, wherein the active layer structure further includes:

a first confinement layer over the first conductive buffer layer, wherein the first confinement layer and the conductive buffer area layer contain identical dopants;

an active layer over the first confinement layer, wherein the active layer is formed using group III–V element-based semiconductor material; and a second confinement layer over the active layer, wherein the second confinement layer and the first confinement layer contain different dopants.

* * * * *